(12) United States Patent
Elian et al.

(10) Patent No.: US 8,124,953 B2
(45) Date of Patent: Feb. 28, 2012

(54) SENSOR DEVICE HAVING A POROUS STRUCTURE ELEMENT

(75) Inventors: Klaus Elian, Alteglofsheim (DE); Georg Meyer-Berg, Muenchen (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 321 days.

(21) Appl. No.: 12/402,912

(22) Filed: Mar. 12, 2009

(65) Prior Publication Data
US 2010/0230766 A1 Sep. 16, 2010

(51) Int. Cl.
*H01L 29/04* (2006.01)
*H01L 47/00* (2006.01)
*H01L 29/417* (2006.01)
*H01L 29/74* (2006.01)
*H01L 31/111* (2006.01)
*H01L 31/0203* (2006.01)

(52) U.S. Cl. ..... 257/3; 257/114; 257/433; 257/E31.013; 257/E31.117; 257/E33.059

(58) Field of Classification Search ................... 257/114, 257/433, E31.013, E31.117, E33.059, 3
See application file for complete search history.

(56) References Cited

U.S. PATENT DOCUMENTS

| | | | |
|---|---|---|---|
| 4,144,636 A * | 3/1979 | Burkhardt et al. ............... 438/49 |
| 4,881,056 A | 11/1989 | Mizukoshi et al. |
| 5,448,444 A | 9/1995 | Provenzano et al. |
| 5,837,958 A | 11/1998 | Fornsel |
| 5,869,749 A * | 2/1999 | Bonne et al. .................. 73/53.01 |
| 6,214,634 B1 * | 4/2001 | Osajda et al. .................... 438/50 |
| 6,229,190 B1 | 5/2001 | Bryzek et al. |
| 6,255,728 B1 | 7/2001 | Nasiri et al. |
| 6,355,937 B2 * | 3/2002 | Antonelli et al. ............. 250/556 |
| 6,551,838 B2 * | 4/2003 | Santini et al. .................. 436/174 |
| 6,596,236 B2 * | 7/2003 | DiMeo et al. .................... 422/88 |
| 7,554,134 B2 * | 6/2009 | Cummins ..................... 257/252 |
| 7,563,634 B2 * | 7/2009 | Benzel ............. 438/53 |
| 7,692,310 B2 * | 4/2010 | Park et al. ..................... 257/777 |
| 7,781,852 B1 * | 8/2010 | Faheem et al. ................ 257/419 |
| 7,803,665 B2 * | 9/2010 | Witvrouw et al. ............ 438/124 |
| 7,825,484 B2 * | 11/2010 | Martin et al. .................. 257/415 |
| 7,858,446 B2 * | 12/2010 | Huang et al. .................. 438/116 |
| 7,885,423 B2 * | 2/2011 | Weigold ........................ 381/174 |
| 2002/0153581 A1 * | 10/2002 | Lin et al. ....................... 257/433 |
| 2005/0081905 A1 * | 4/2005 | Lan et al. ....................... 136/224 |
| 2005/0150761 A1 * | 7/2005 | Lauks ........................... 204/400 |
| 2005/0186703 A1 * | 8/2005 | Weiblen et al. .............. 438/106 |
| 2005/0194685 A1 * | 9/2005 | Weiblen et al. .............. 257/738 |
| 2005/0218488 A1 | 10/2005 | Matsuo |
| 2006/0081062 A1 * | 4/2006 | Silverbrook et al. ........... 73/754 |
| 2006/0124458 A1 | 6/2006 | Nauber et al. |
| 2006/0185429 A1 * | 8/2006 | Liu et al. ....................... 73/146.5 |
| 2008/0079142 A1 * | 4/2008 | Carmona et al. ............. 257/704 |
| 2008/0105941 A1 * | 5/2008 | Chang et al. .................. 257/433 |
| 2010/0133631 A1 * | 6/2010 | Benzel ........................... 257/417 |
| 2010/0137696 A1 * | 6/2010 | Santini et al. ................. 600/345 |

\* cited by examiner

*Primary Examiner* — Ida M Soward
(74) *Attorney, Agent, or Firm* — Dicke, Billig & Czaja, PLLC (57) ABSTRACT

A sensor device and method. One embodiment provides a first semiconductor chip having a sensing region. A porous structure element is attached to the first semiconductor chip. A first region of the porous structure element faces the sensing region of the first semiconductor chip. An encapsulation material partially encapsulates the first semiconductor chip and the porous structure element.

17 Claims, 12 Drawing Sheets

SENSOR DEVICE HAVING A POROUS STRUCTURE ELEMENT

BACKGROUND

This invention relates to an electronic device including a sensor and a method of manufacturing thereof.

In the development of devices including sensors special requirements may be taken into account, in particular when designing the package of a sensor device. For example, certain sensors, such as pressure sensors, gas sensors or humidity sensors, may require an opening through which the fluid which is to be detected is applied to the sensor.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing sensors are described below. A sensor measures (or senses) a physical variable, such as for example pressure, temperature, occurrence and/or quantity of a substance, magnetic field, humidity etc., and converts the measured variable to a signal which can be read by an observer or an instrument. Examples of sensors are pressure sensors, tire pressure sensors, gas sensors and humidity sensors. Sensors may include a sensing region which allow to measure the desired variable. In the case of a pressure sensor, the sensor surface may be a surface of a membrane which is used for measuring the pressure of a fluid, such as a gas or a liquid. Other examples of a sensing region are a cantilever, a bridge, a gas sensing surface and a tongue structure. The sensors may be configured as MEMS (micro-electro mechanical systems) and may include micro-mechanical structures, such as bridges, membranes or tongue structures.

The sensors may be integrated in semiconductor chips. Furthermore, the sensor devices described below may contain one or more additional semiconductor chips which do not contain sensors. The semiconductor chips may be of different types, may be manufactured by different technologies and may include for example integrated electrical, electro-optical or electromechanical circuits or passives. The integrated circuits may, for example, be designed as logic integrated circuits, analog integrated circuits, mixed signal integrated circuits, power integrated circuits, memory circuits or integrated passives. The semiconductor chips may be configured as antennas and/or discrete passives and/or chip stacks. Semiconductor chips in which such functional elements are embedded generally contain electronic circuits which serve for driving the functional elements or further processing signals generated by the functional elements. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals. Moreover, the semiconductor chips may be packaged or unpackaged.

The semiconductor chips may have contact pads (or electrodes) which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main faces of the semiconductor chips or on other faces of the semiconductor chips.

The sensor devices described below include external contact elements or external contact pads, which may be of any shape and size. The external contact elements may be accessible from outside the sensor device and may thus allow electrical contact to be made with the semiconductor chips from outside the sensor device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. Solder material, such as solder balls or solder bumps, may be deposited on the external contact elements.

The semiconductor chips containing the sensors may be attached to porous structure elements. The porous structure elements may be made of a solid material permeated by an interconnected network of pores (voids). The interconnected network of pores may allow fluid flow through the structure element. Although the porous structure element may cover the semiconductor chip and in particular the sensing region of the semiconductor chip, the sensing region may be in fluid connection with the outside of the sensor device. Thus the fluid (gas or liquid) to be detected may permeate through the porous structure element to the sensing region of the semiconductor chip. The diameter of the pores of the porous structure element may be in the range from 10 nm to 500 μm and in particular in the range from 0.5 μm to 200 μm. The pores may be uniformly or non-uniformly distributed over the porous structure element. Porous material of which the porous structure element may be made are, for example, glass frit, ceramic frit, porous adhesive material, aerogel and porous metal. An example of porous metal is cast iron. The porous structure element may be made of one piece and may not have additional channels or openings which are larger than the pores of the porous structure element.

The structure element may also be made of a non-porous material which does not allow fluid flow through this material. In this case one or more channels may be introduced into the structure element. The structure element may have at least one inlet at its outside surface and at least one outlet next to the sensing region of the semiconductor chip. The inlets and outlets may be in fluid connection by using the channels through the structure element. The non-porous structure element may be made of glass, ceramics, plastics or any other appropriate material.

The semiconductor chips or at least parts of the semiconductor chips may be covered with an encapsulation material, which may be electrically insulating. The encapsulation material may be any appropriate laminate (prepreg) or thermoplastic or thermosetting material. The encapsulation material may, for example, be a mold material which may be based on an epoxy material and may contain a filling material consisting of small particles of glass ($SiO_2$) or other electrically insulating mineral filler materials like $Al_2O_3$ or organic filler materials. Various techniques may be employed to cover the semiconductor chips with the mold material, for example compression molding, injection molding, powder molding, liquid molding and transfer molding.

The sensors, which may be integrated in semiconductor chips, as well as further semiconductor chips may be placed on carriers. The carriers may be of any shape, size or material. During the fabrication of the devices the carriers may be connected to each other. The carriers may also be made from one piece. The carriers may be connected among each other by connection means with the purpose of separating the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, in particular copper, copper alloys, iron nickel, aluminum, aluminum alloys, or other appropriate materials. The carriers may be, for example, a leadframe or a part of a leadframe. Furthermore, the carriers may be plated with an electrically conductive material, for example copper, silver, iron nickel or nickel phosphorus.

Figure 1:
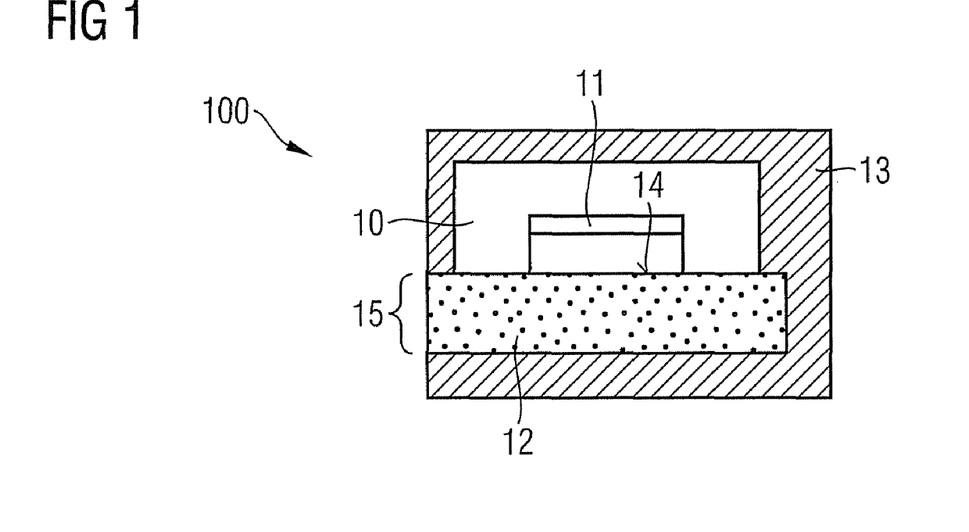
FIG. 1 schematically illustrates one embodiment of a sensor device including a semiconductor chip having a sensing region, a porous structure element and an encapsulation material.

FIG. 1 schematically illustrates a sensor device 100 in cross section. The sensor device 100 includes a first semiconductor chip 10 having a sensing region 11, a porous structure element 12 and an encapsulation material 13. The porous structure element 12 is attached to the first semiconductor chip 10 with a first region 14 of the porous structure element 12 facing the sensing region 11 of the first semiconductor chip 10. The encapsulation material 13 encapsulates the first semiconductor chip 10 and the porous structure element 12 only partially.

The encapsulation material 13 may encapsulate the porous structure element 12 such that a second region 15 of the porous structure element 12 may be exposed from the encapsulation material 13 and may be in contact with the outside environment a parameter of which is to be detected by the sensor device 100. The first region 14 of the porous structure element 12 may be in fluid connection with the second region 15 of the porous structure element 12. Due to this fluid connection, the sensing region 11 of the first semiconductor chip 10 may be in fluid connection with the outside environment.

Figure 2:
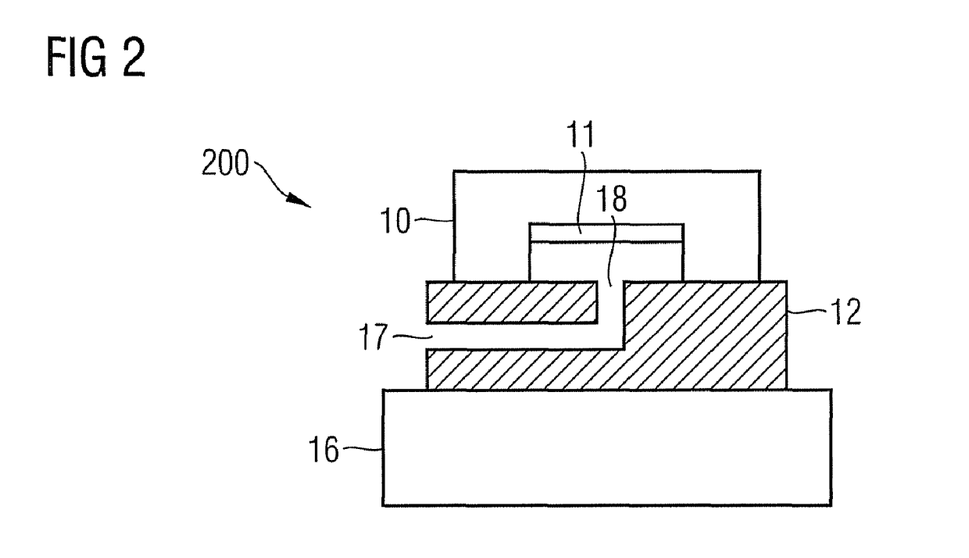
FIG. 2 schematically illustrates one embodiment of a sensor device including a semiconductor chip having a sensing region, a structure element and a carrier.

FIG. 2 schematically illustrates a sensor device 200 in cross section. The sensor device 200 includes a first semiconductor chip 10 having a sensing region 11, a structure element 12 and a carrier 16. The structure element 12 may be stacked on the carrier 16, and the first semiconductor chip 10 may be stacked on the structure element 12. The structure element 12 may have an inlet 17 and an outlet 18. The outlet 18 may be in fluid connection with the inlet 17 and the sensing region 11 of the first semiconductor chip 10. This may allow the sensing region 11 of the first semiconductor chip 10 to be in fluid connection with the environment outside of the sensor device 200.

The carrier 16 may, for example, be a second semiconductor chip or a leadframe or any other substrate.

Figure 3A:
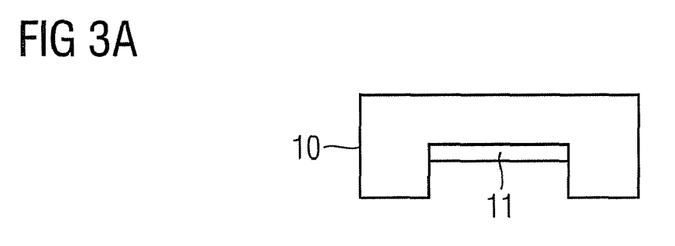
FIGS. 3A to 3C schematically illustrate one embodiment of a method to manufacture a sensor device.
Figure 3B:
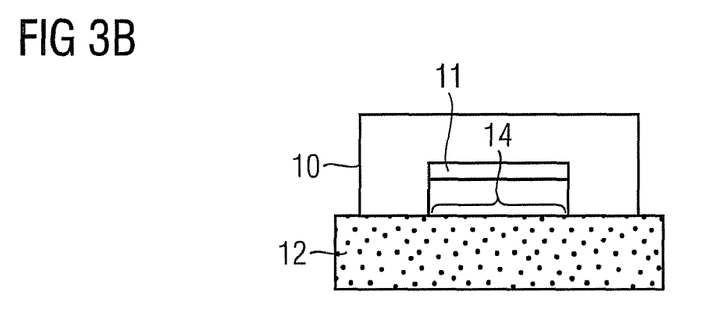
Figure 3C:
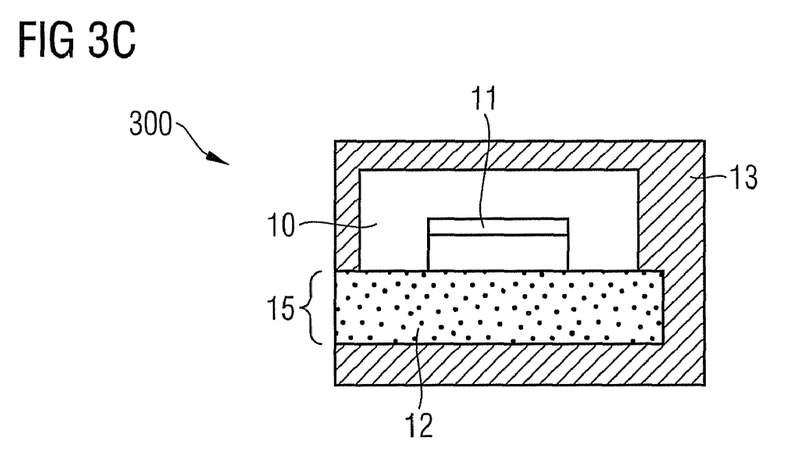

FIGS. 3A to 3C schematically illustrate a method for manufacturing a sensor device 300, which is illustrated in cross section in FIG. 3C. Firstly, a first semiconductor chip 10 having a sensing region 11 is provided (see FIG. 3A). The first semiconductor chip 10 is attached to a porous structure element 12 such that the sensing region 11 faces a first region 14 of the porous structure element 12 (see FIG. 3B). The first semiconductor chip 10 and the porous structure element 12 are encapsulated such that a second region 15 of the porous structure element 12 remains exposed. An encapsulation material 13, for example a mold material or a laminate, may be used to encapsulate the first semiconductor chip 10 and the porous structure element 12. The first region 14 of the porous structure element 12 may be in fluid connection with the second region 15 of the porous structure element 12.

Figure 4:
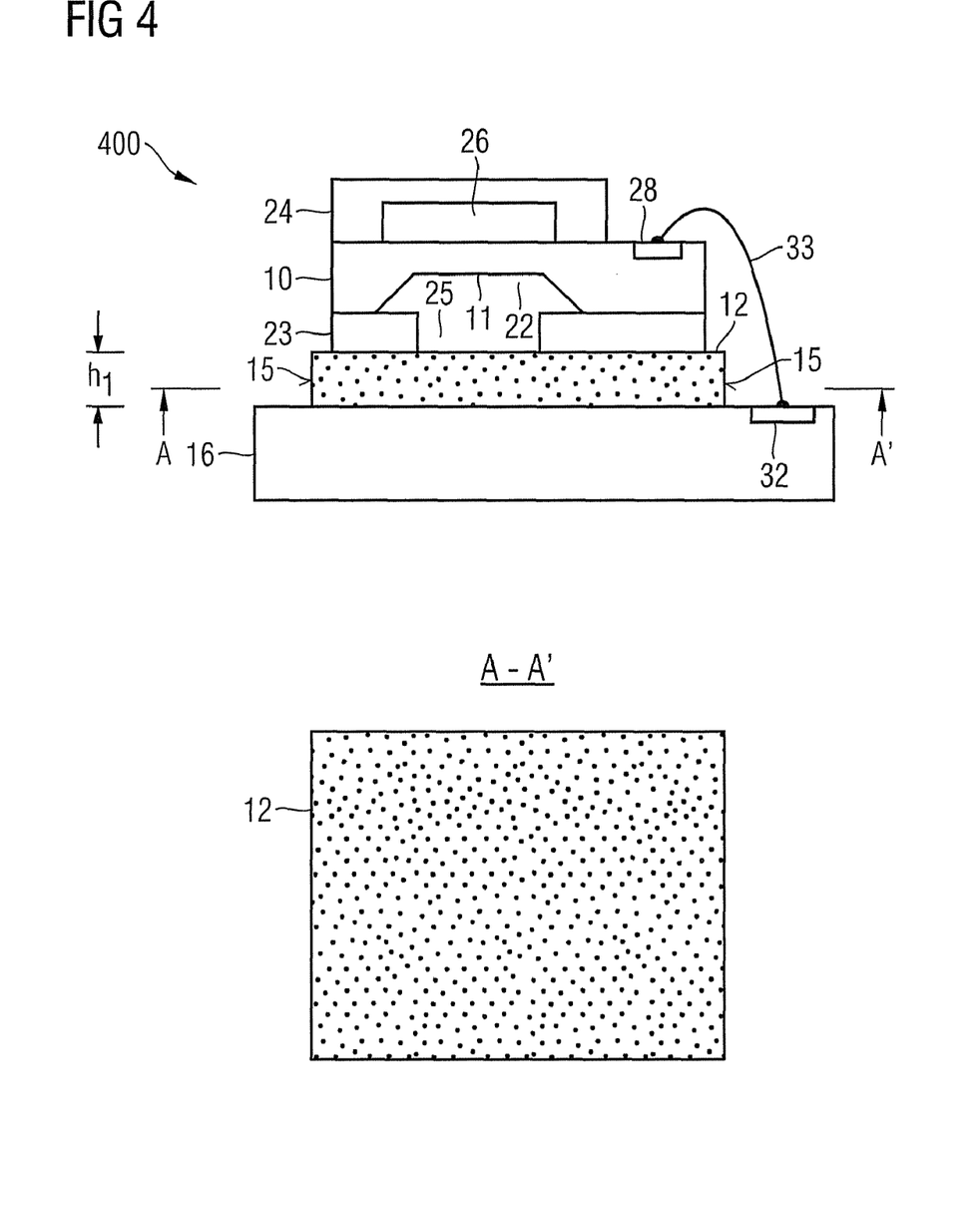
FIG. 4 schematically illustrates one embodiment of a sensor device including a first semiconductor chip having a sensing region, a porous structure element and a second semiconductor chip.

FIG. 4 schematically illustrates a sensor device 400 in cross section (top) and along a line A-A' (bottom). The sensor device 400 is an implementation of the sensor device 100 shown in FIG. 1. The details of the sensor device 400 that are described below can therefore be likewise applied to the sensor device 100.

Figure 5:
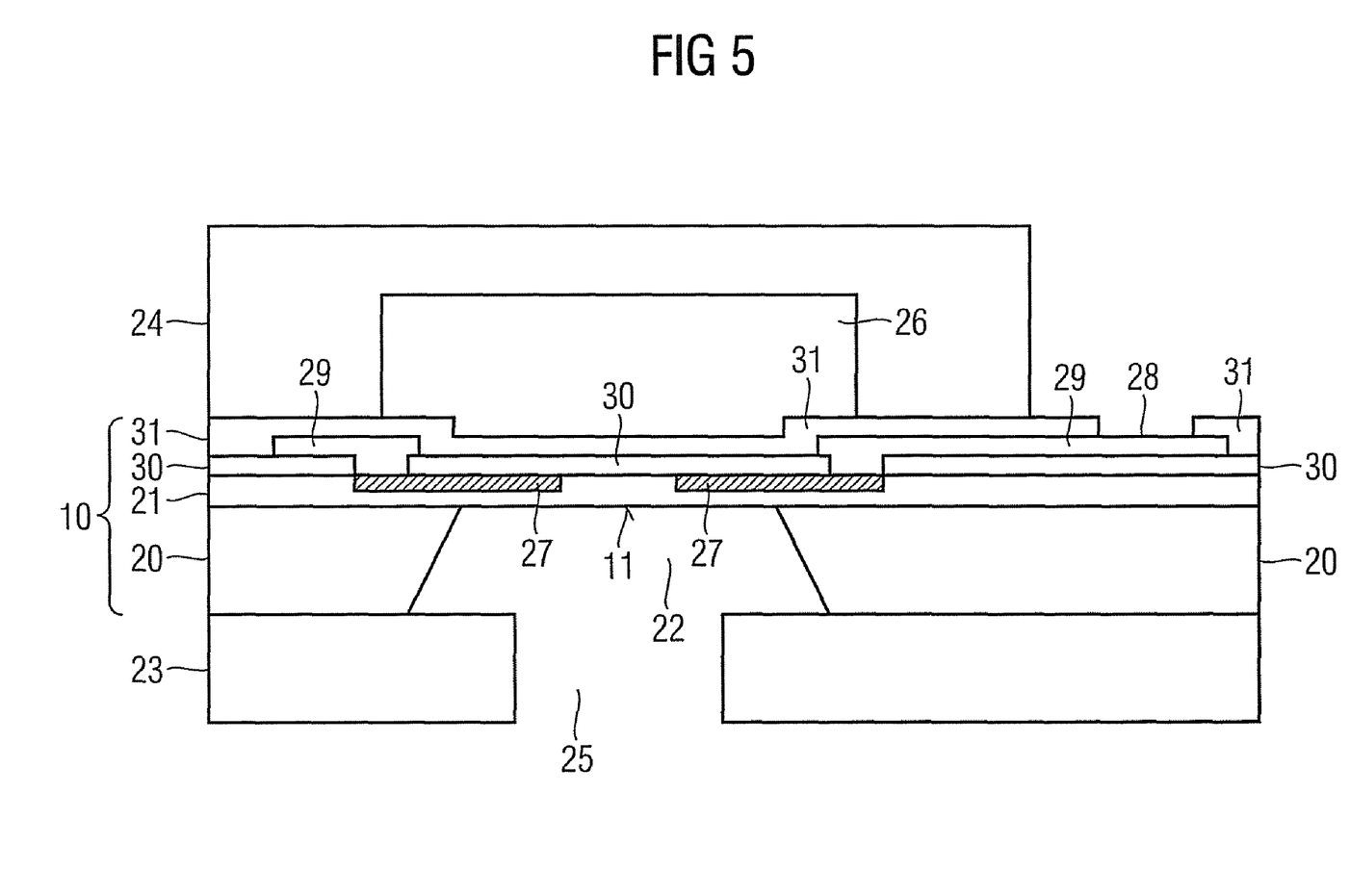
FIG. 5 schematically illustrates one embodiment of a semiconductor chip having a sensing region arranged between two substrates.

In one embodiment, the sensor device 400 includes a pressure sensor. The pressure sensor is integrated in the first semiconductor chip 10. More details of the first semiconductor chip 10 are schematically illustrated in FIG. 5. The first semiconductor chip 10 may contain a silicon body 20, which may be manufactured of p-type doped silicon, and a membrane 21, which may be manufactured of n-type doped silicon. The membrane 21 is arranged over a recess (opening) 22 formed in the silicon body 20. The recess 22 exposes the sensing region 11 of the first semiconductor chip 10, which is the lower surface of the membrane 21 exposed by the recess 22.

When integrated in the sensor device 400, the first semiconductor chip 10 may be placed on a substrate 23. Furthermore, a substrate 24 may be stacked on top of the first semiconductor chip 10. Both substrates 23 and 24 may be manufactured of glass, silicon or another appropriate material. The substrates 23 and 24 may have been attached to the first semiconductor chip 10 when the first semiconductor chip 10 was still in the wafer bond. The substrates 23 and 24 may have been attached to the semiconductor wafer by anodic bonding and thereafter the semiconductor wafer may have been diced thereby separating the individual first semiconductor chips 10. The substrate 23 has a through-hole 25 in the area of the recess 22, and the substrate 24 has a recess 26 over the membrane 21. The recess 26 in the substrate 24 forms a sealed cavity over the membrane 21. This cavity may be filled with a gas at a reference pressure. The deflection of the membrane 21 which is due to different pressures on both sides of the membrane 21 is a measure of the pressure to be sensed.

There are two main types of pressure sensor, resistive and capacitive. Both types of theses sensors rely on the deflection of the membrane 21 under an applied pressure difference. The resistive-type pressure sensor may employ a number of piezoresistors 27 on one face of the membrane 21. Two of these piezoresistors 27 are illustrated in FIG. 5. The piezoresistors 27 are electrically coupled to contact pads 28 of the first semiconductor chip 10 by using conductor tracks 29. The first semiconductor chip 10 may include any number of contact pads 28, in FIGS. 4 and 5 only one of the contact pads 28 is illustrated. The conductor tracks 29 may be made of any appropriate metal or metal alloy, for example aluminum or copper. The conductor tracks 29 are arranged between electrically insulating layers 30 and 31, which may for example be made of silicon nitride, photoresist or any other appropriate electrically insulating material.

The substrate 23 may be stacked on top of the porous structure element 12. The porous structure element 12 may be made of a solid material permeated by an interconnected network of pores (voids). The interconnected network of pores may allow fluid flow through the structure element 12. Although the porous structure element 12 may completely cover the through-hole 25 in the substrate 23, the sensing region 11 of the membrane 21 may be in fluid connection with the outside of the sensor device 400 due to the porosity of the porous structure element 12. This is because at least one or more side walls 15 of the porous structure element 12 may be exposed to the outer environment. Thus the fluid to be detected, which may be a gas or liquid, may permeate through the porous structure element 12 to the membrane 21.

The pores of the porous structure element 12 may not all have the same diameter. The diameters of the pores may be distributed over a certain range. For example, the diameters of the pores of the porous structure element 12 may be in the range from 10 nm to 500 µm and in particular in the range from 0.5 µm to 200 µm. In particular, the diameters of the pores may be smaller than 500 µm, 400 µm, 300 µm, 200 µm, 100 µm, 50 µm, 10 µm or 1 µm. The pores may be uniformly or non-uniformly distributed over the porous structure element 12. Porous material of which the porous structure element 12 may be made are, for example, glass frit, ceramic frit, porous adhesive material, aerogel and porous metal. An example of porous metal is cast iron. The porous structure element 12 may be made of one piece and may not have additional channels or openings which are larger than the pores of the porous structure element 12. The height $h_1$ of the porous structure element 12 may be greater than 20 µm.

The surface of the porous structure element 12 which faces the substrate 23 may be larger than or equal to or smaller than the surface of the substrate 23 facing the porous structure element 12.

The porous structure element 12 may be stacked on a second semiconductor chip 16, which may be an ASIC (Application Specific Integrated Circuit). The second semiconductor chip 16 may have one or more contact pads 32. The contact pads 32 may, for example, be located on the upper surface of the second semiconductor chip 16. One of the contact pads 32 is exemplarily shown in FIG. 4. Some of the contact pads 32 of the second semiconductor chips 16 may be electrically coupled to the contact pads 28 of the first semiconductor chip 10, for example by using bond wires 33.

The function of the second semiconductor chip 16 may be to control the first semiconductor chip 10 and/or to record the sensor signals obtained from the sensor of the first semiconductor chip 10 and to process and/or evaluate the sensor signals. The arrangement of the porous structure element 12 between the first and second semiconductor chips 10 and 16 allows the recess 22 in the first semiconductor chip 10 and the through-hole 25 in the substrate 23 to face towards the second semiconductor chip 16. Due to the porosity of the porous structure element 12 it is still possible that the membrane 21 is in fluid connection with the environment outside the sensor device 400.

Figure 6:
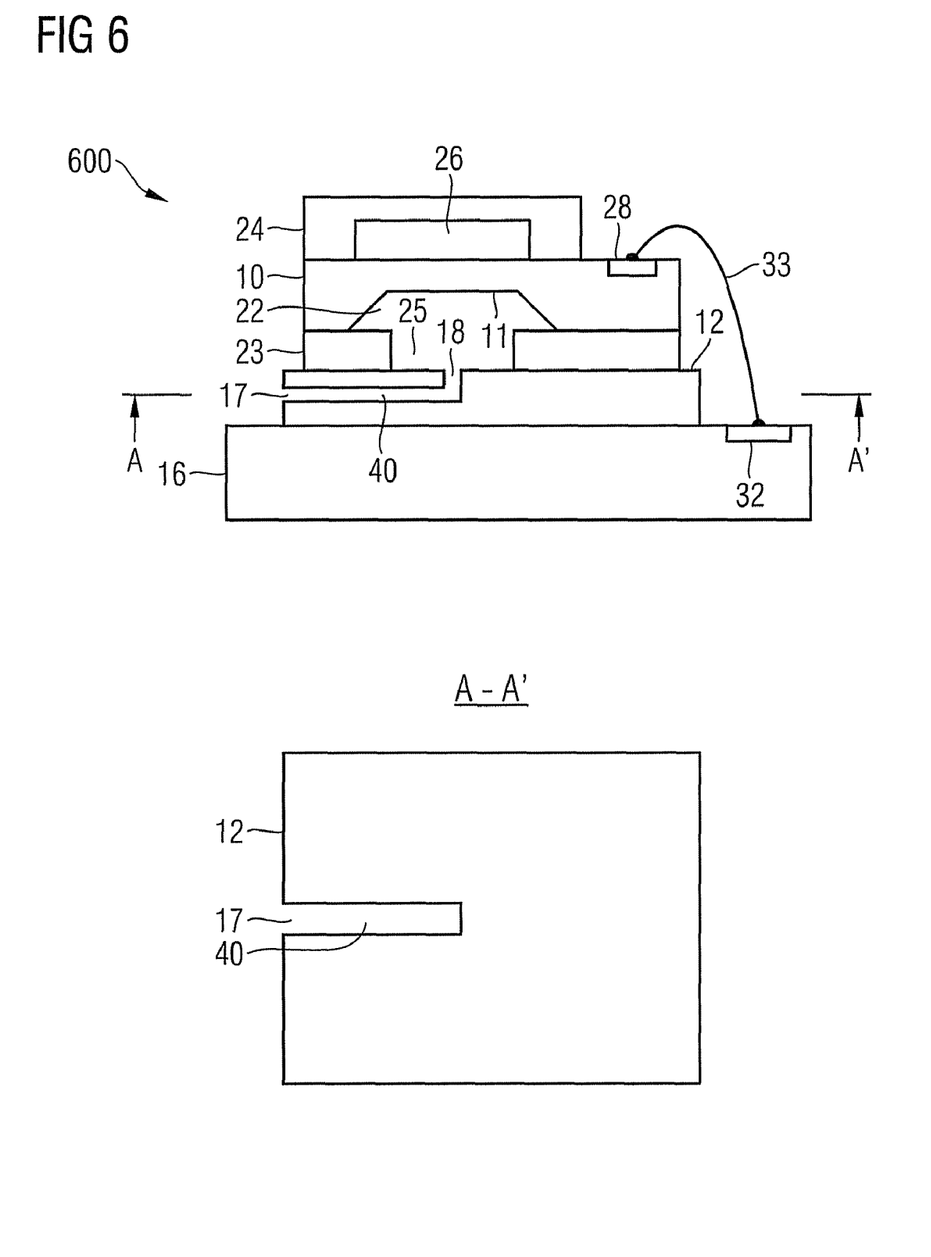
FIG. 6 schematically illustrates one embodiment of a sensor device including a first semiconductor chip having a sensing region, a structure element having an inlet and an outlet and a second semiconductor chip.

FIG. 6 schematically illustrates a sensor device 600 in cross section (top) and along a line A-A' (bottom). The sensor device 600 is an implementation of the sensor device 200 shown in FIG. 2. The details of the sensor device 600 that are described below can therefore be likewise applied to the sensor device 200.

The sensor device 600 is almost identical to the sensor device 400. The only difference between the sensor devices 400 and 600 is the structure element 12 arranged between the first semiconductor chip 10 and the second semiconductor chip 16. The structure element 12 of the sensor device 600 is made of a non-porous material. In general, this material does not allow fluid flow through the material. In order to have a fluid connection between the environment outside the device 600 and the sensing region 11 of the first semiconductor chip 10, a channel 40 has been introduced into the structure element 12. The channel 40 may have an inlet 17 at one of the side surfaces of the structure element 12 and an outlet on the upper surface of the structure element 12 next to the sensing region 11 of the first semiconductor chip 10. The inlet 17 and the outlet 18 may be in fluid connection by using the channel 40 through the structure element 12. The channel 40 may be of any shape and may have a minimum diameter of at least 100 µm, 300 µm, 500 µm, 600 µm, 700 µm, 800 µm, 900 µm or 1 mm. The structure element 12 may be made of any suitable material, for example glass, ceramics or plastics.

Figure 7:
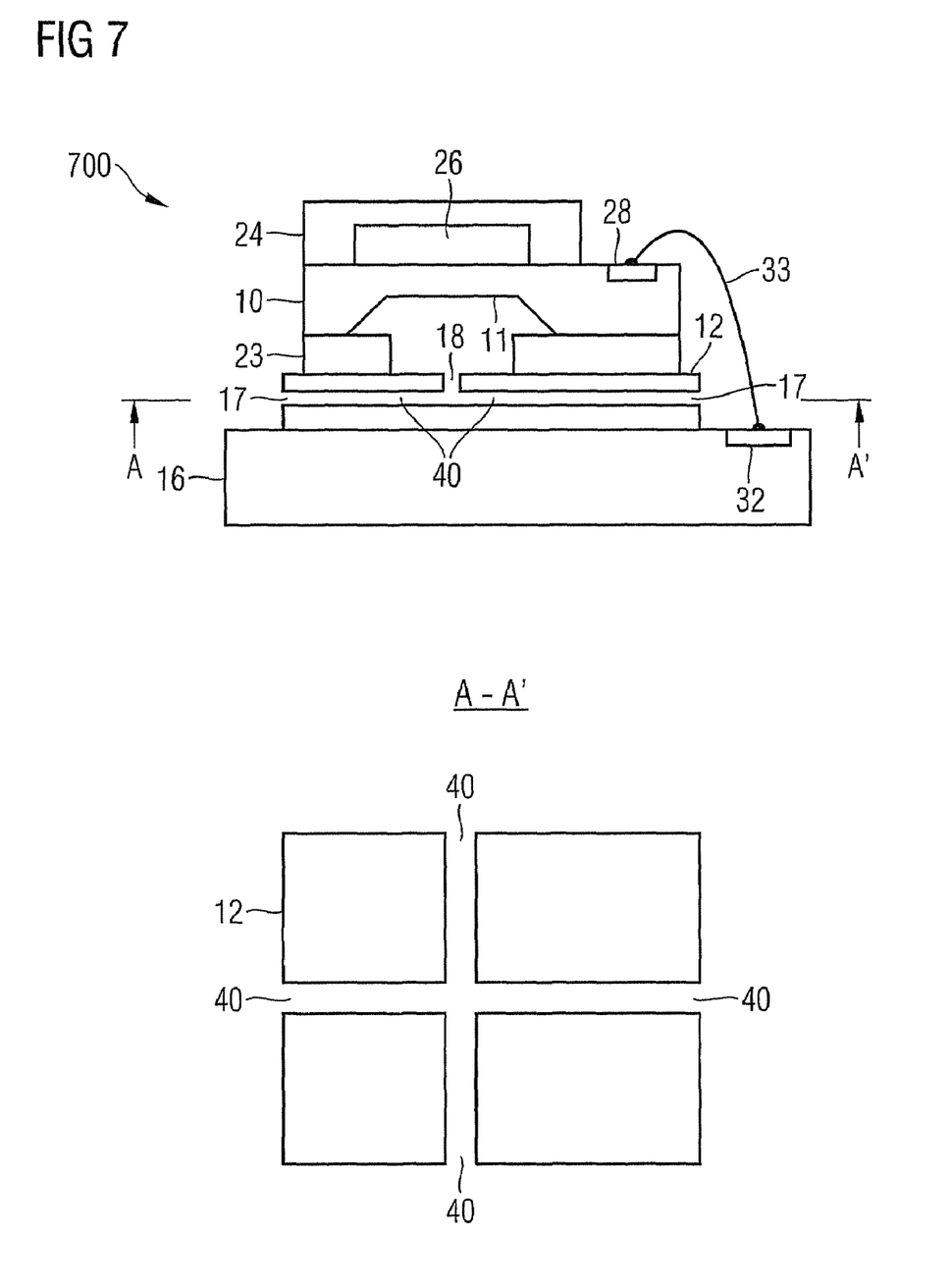
FIG. 7 schematically illustrates one embodiment of a sensor device including a first semiconductor chip having a sensing region, a structure element having multiple inlets and an outlet and a second semiconductor chip.

In one embodiment, the structure element 12 has more than just one channel 40. Such a sensor device 700 is schematically illustrated in FIG. 7. The sensor device 700 has four channels 40 and each of the channels 40 leads to a respective one of the side surfaces of the structure element 12. Furthermore, the structure element 12 may have any number of channels and any number of inlets and outlets.

Figure 8:
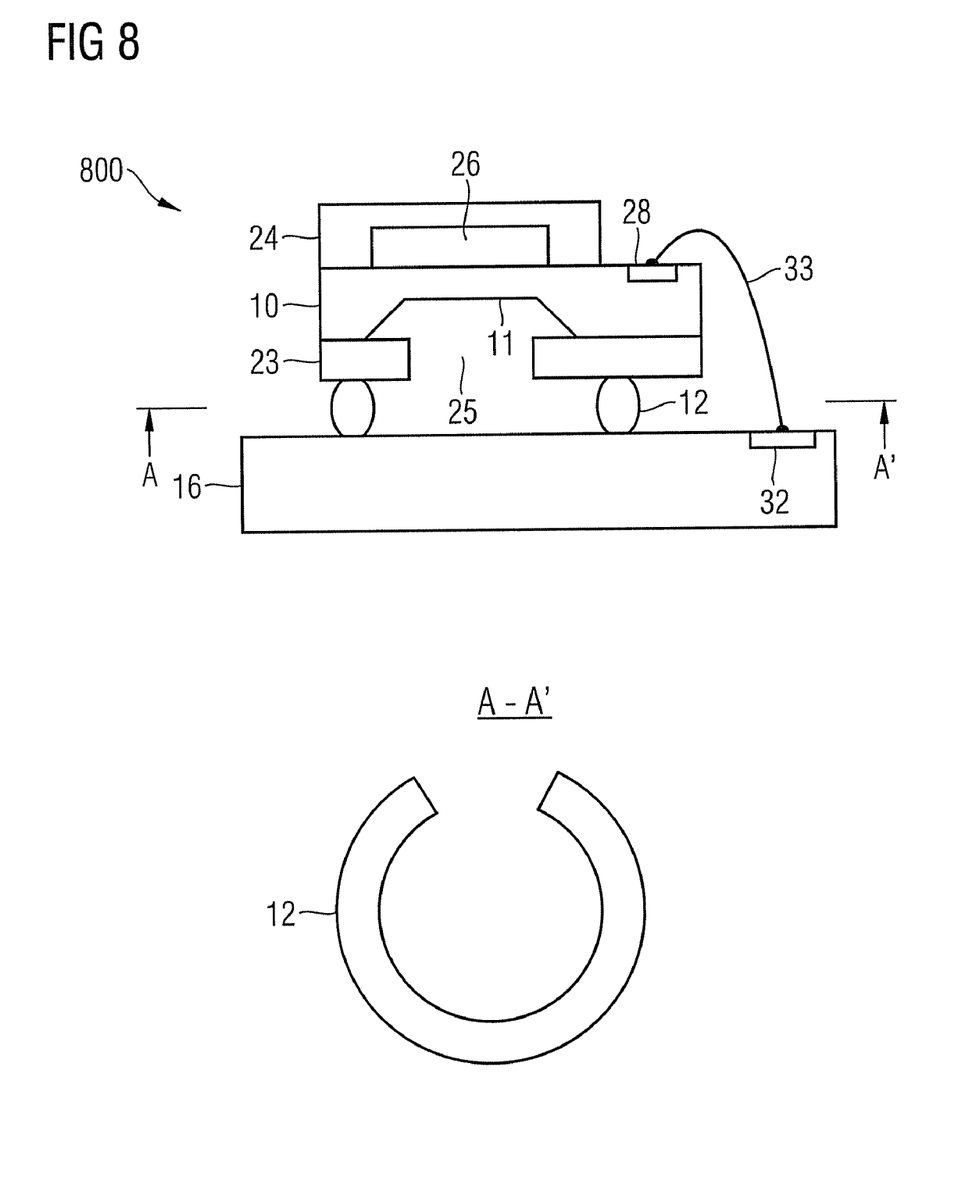
FIG. 8 schematically illustrates one embodiment of a sensor device including a first semiconductor chip having a sensing region, an o-ring and a second semiconductor chip.

In one embodiment, which is schematically illustrated in FIG. 8, a sensor device 800 includes an o-ring as the structure element 12. The o-ring 12 misses at least one section which allows fluid flow from the outside of the sensor device 800 to the sensing region 11 of the first semiconductor chip 10. The o-ring 12 may be made of any appropriate material, for example glass, silicone, polymers, plastics or ceramics.

It is obvious to a person skilled in the art that the devices 100 to 800 described above and illustrated in FIGS. 1 to 8 are only intended to be exemplary embodiments, and many variations are possible. For example, additional semiconductor chips or passives of different types may be included in the same device. The semiconductor chips and passives may differ in function, size, manufacturing technology etc.

Instead of a pressure sensor, other kinds of sensors may be integrated in the sensor devices 100 to 800, for example gas or humidity sensors. In case the first semiconductor chip 10 includes a gas sensor, the sensing region 11 of the first semiconductor chip 10 may be a functionalized surface. If this surface is exposed to a gas, specific gas molecules adsorb onto the functionalized surface, thereby changing the electrical conductivity of the sensing surface. This change in electrical conductivity may be measured in order to determine the occurrence of the desired gas and/or its proportion in the gas being analyzed.

In order to avoid humidity or water to penetrate the structure element 12 and to impair the function of the sensor devices 100 to 800, the outer surface of the structure element 12 or the entire surface of the structure element 12 may be coated with an hydrophobic layer. For example, polytetrafluoroethylene (commercially available under the tradename Teflon) or other fluor-containing organic polymers may be deposited on the surface of the structure element 12. In one embodiment, the devices 100 to 800 may contain a heating element, for example a resistor or a conductor loop, in order to heat the structure element 12 to keep it free of humidity or water. In one embodiment, the pores of the porous structure element 12 may be small enough that the coating of the fluor-containing organic polymers has a hydrophilic effect so that the sensor devices 100 to 800 may function as humidity sensors.

Figure 9:
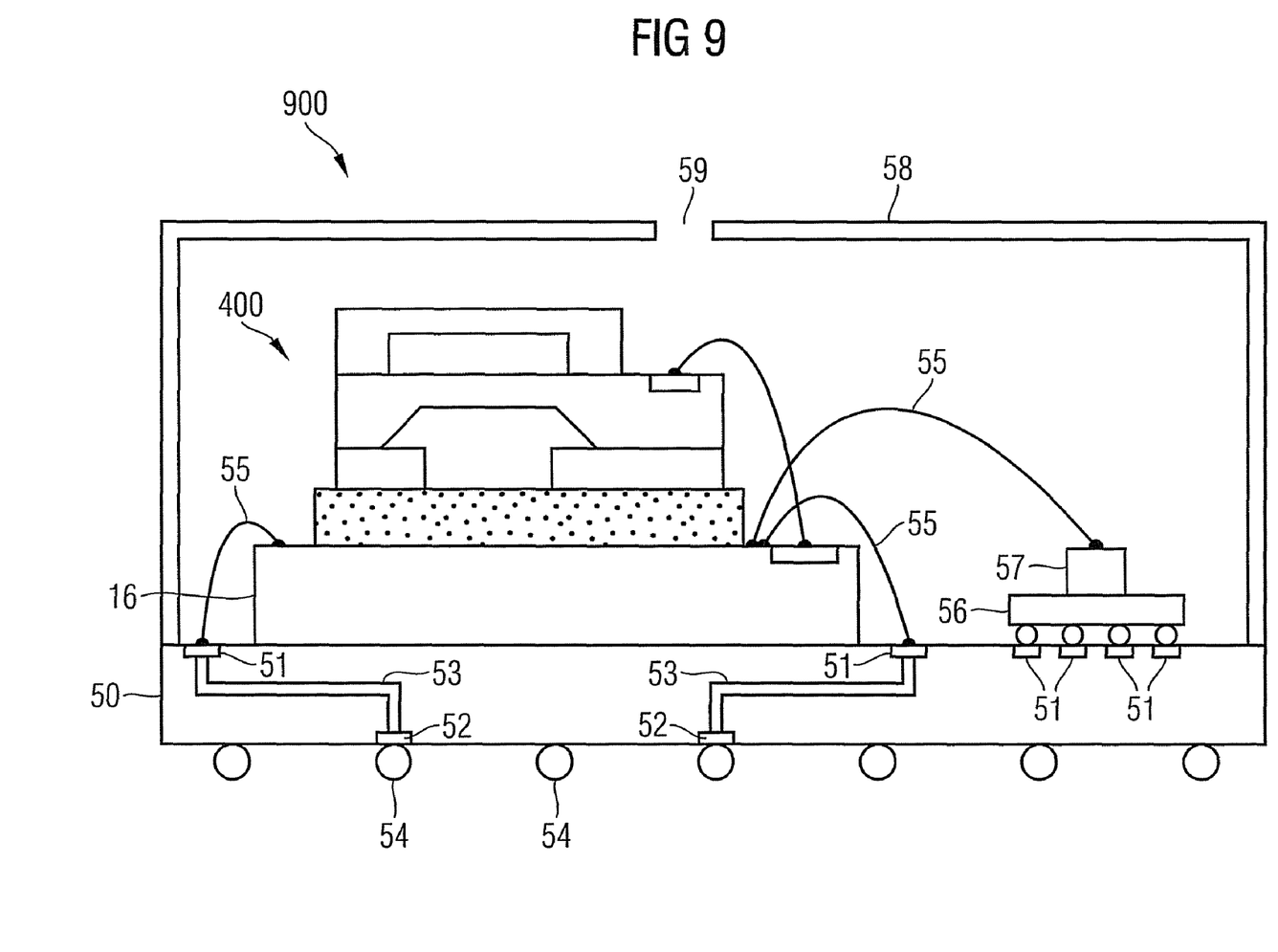
FIG. 9 schematically illustrates one embodiment of a device including a sensor device.

The devices 100 to 800 may also be integrated in other devices. An example of such a device 900 is schematically illustrated in FIG. 9 in cross section. The device 900 may contain a circuit board 50, which may be a PCB (Printed Circuit Board). The circuit board 50 may include contact pads 51 on its upper surface and external contact pads 52 on its lower surface. Furthermore, the circuit board 52 may contain one or more wiring layers 53 to electrically couple the contact pads 51, 52 with each other. Some of the contact pads 51, 52 and the wiring layers 53 are exemplarily illustrated in FIG. 9. Solder deposits 54 may be deposited on the external contact pads 52.

The sensor device 400 may be attached to the upper surface of the circuit board 50. The second semiconductor chip 16 may be electrically coupled to the contact pads 51 of the circuit board 50 and other semiconductor chips by bond wires 55 or other appropriate connections means. Moreover, a semiconductor chip 56 may be mounted on the circuit board 50 in a flip-chip manner, and a semiconductor chip 57 may be stacked on the semiconductor chip 56. A housing 58 having a through-hole 59 may protect the semiconductor chips and devices mounted on the circuit board 50.

In one embodiment, the device 900 may be a tire pressure sensor. The sensor device 400 may be embodied as a pressure sensor, the semiconductor chip 56 may include a radio transceiver, and the semiconductor chip 57 may include a BAW (Bulk Acoustic Wave) filter.

Figure 10A:
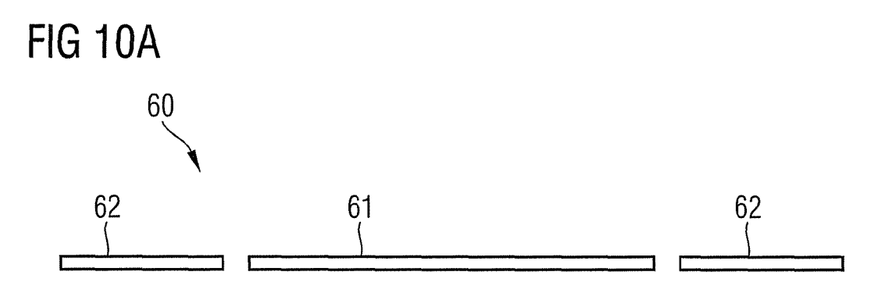
FIGS. 10A to 10G schematically illustrate one embodiment of a method to manufacture a sensor device including a semiconductor chip having a sensing region, a porous structure element and an encapsulation material.
Figure 10B:
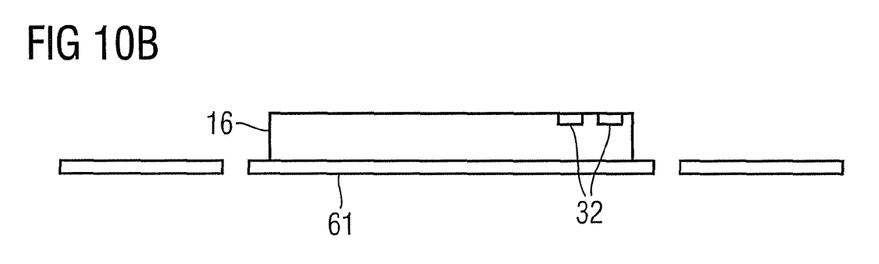
Figure 10C:
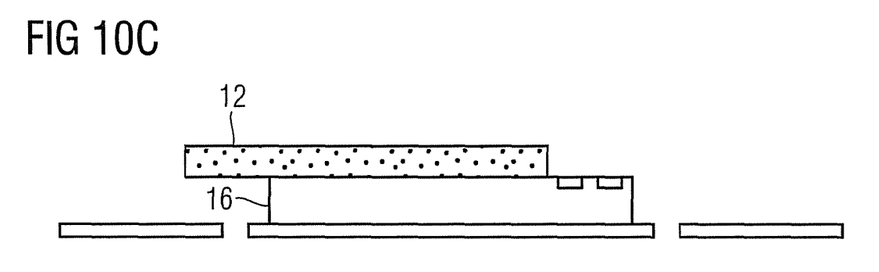
Figure 10D:
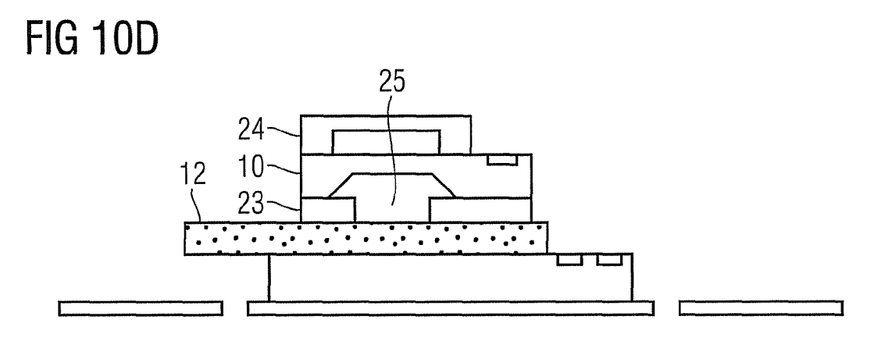
Figure 10E:
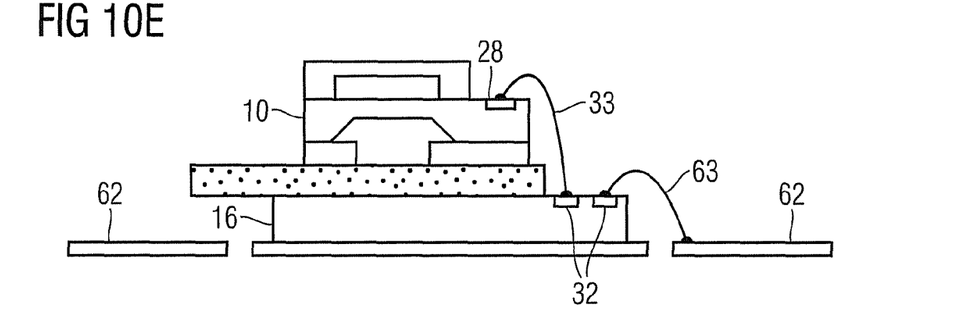
Figure 10F:
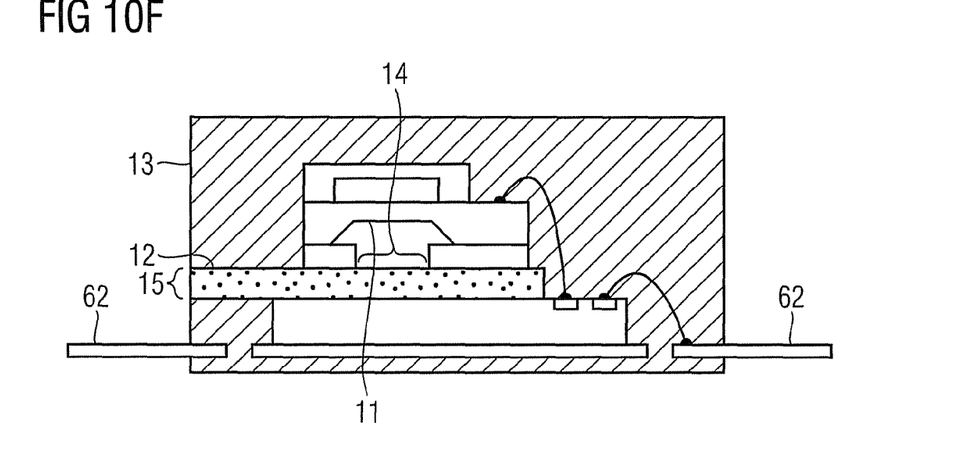
Figure 10G:
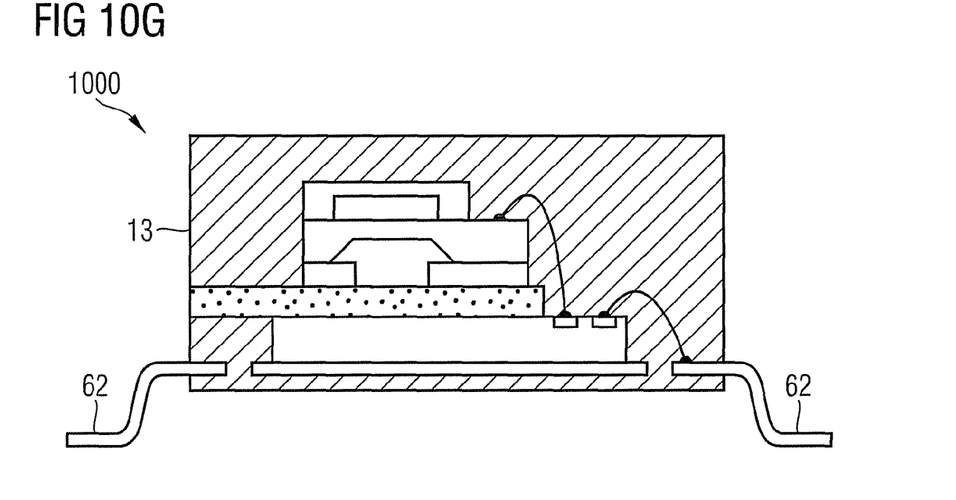

FIGS. 10A to 10G schematically illustrate a method for manufacturing a sensor device 1000, a cross section of which is illustrated in FIG. 10G. The sensor device 1000 is one implementation of the sensor devices 100 to 800. The details of the sensor device 1000 that are described below can therefore be likewise applied to the sensor devices 100 to 800. Furthermore, the method illustrated in FIGS. 10A to 10G is an implementation of the method illustrated in FIGS. 3A to 3C. The details of the production method that are described below can therefore be likewise applied to the method of FIGS. 3A to 3C.

In order to manufacture the device 1000, a leadframe 60 may be provided which is illustrated in FIG. 10A in cross section. The leadframe 60 may include one or more die pads 61 and a plurality of leads 62. The leadframe 60 may be manufactured from a metal or metal alloy, in particular copper, a copper alloy, iron nickel, aluminum, or other appropriate materials. Furthermore, the leadframe 60 may be plated with an electrically conductive material, for example copper, silver, iron nickel or nickel phosphorus. The shape of the leadframe 60 is not limited to any size or geometric shape. The leadframe 60 may have been manufactured by punching a metal plate. The die pads 61 and leads 62 of the leadframe 60 may be connected to each other by dams (not shown in FIG. 10A).

As illustrated in FIG. 10B, the second semiconductor chip 16 is placed over the die pad 61. In the present embodiment, the second semiconductor chip 16 is mounted on the die pad 61 with the contact pads 32 facing away from the die pad 61. The second semiconductor chip 16 may be attached to the die pad 61 by using an appropriate adhesive material.

As illustrated in FIG. 10C, the porous structure element 12 is mounted on the upper surface of the second semiconductor chip 16 using an appropriate adhesive material, for example glue. In the present embodiment, the porous structure element 12 protrudes over at least one side surface of the second semiconductor chip 16. The porous structure element 12 may have been separated from a larger piece of porous material, for example by cutting, sawing, etching or laser ablation.

As illustrated in FIG. 10D, the stack including the substrate 23, the first semiconductor chip 10 and the substrate 24 may be mounted on the upper surface of the porous structure element 12 using an appropriate adhesive material, for example glue. The substrate 23 may be placed over the porous structure element 12 such that the through-hole 25 in the substrate 23 is completely covered by the porous structure element 12.

Additional semiconductor chips and/or components may be placed over the die pad 61. Furthermore, the leadframe 60 may contain further die pads, which are not illustrated in FIGS. 10A to 10G and on which further semiconductor chips and/or components may be placed.

Electrical interconnections may be established between the contact pads 28 and 32 of the semiconductor chips 10 and 16 and the leads 62 of the leadframe 60. Two examples of these interconnections are illustrated in FIG. 10E where the interconnections are made by wire bonding. The bond wire 33 connects one of the contact pads 28 with one of the contact pads 32, and the bond wire 63 connects one of the contact pads 32 with one of the leads 62. For example, ball bonding or wedge bonding may be used as the interconnect technique. The bond wires 33, 63 may be made up of gold, aluminum, copper or any other appropriate electrically conductive material.

Instead of wire bonding, other interconnect techniques may be used. For example, metallic clips may be placed on the semiconductor chips 10 and 16 as well as the leads 62 or flip-chip bonding may be used to establish the electrical interconnections.

A mold transfer process may be carried out to encapsulate the components arranged on the leadframe 60 with a mold material (encapsulation material) 13 as illustrated in FIG. 10F. The mold material 13 may encapsulate any portion of the device 1000, but leaves at least the second region 15 of the porous structure element 12 uncovered. In one embodiment, the second region 15 of the porous structure element 12 includes at least a side surface of the porous structure element 12. The second region 15 of the porous structure element 12 is in fluid connection with the first region 14 of the porous structure element 12. Due to this fluid connection, the sensing region 11 of the first semiconductor chip 10 is in fluid connection with the outside environment.

Moreover, some parts of the leads 62 are not covered with the mold material 13. The exposed parts of the leads 62 may be used as external contact elements to electrically couple the device 1000 to other components, for example a circuit board, such as a PCB.

In order to apply the mold material 13 to the components arranged on the leadframe 60, the leadframe 60 may be placed in a mold form or mold cavity (not illustrated in FIG. 10F). The mold cavity is a hollowed-out block that is filled with the mold material 13 after placing the leadframe 60 in the mold cavity. After the mold material 13 has hardened inside the mold cavity, the mold material 13 adopts the shape of the mold cavity.

The mold material 13 may be composed of any appropriate electrically insulating thermoplastic or thermosetting material, in one embodiment it may be composed of a material commonly used in contemporary semiconductor packaging technology. The mold material 13 may be based on an epoxy material and may contain a filling material consisting of small particles of glass ($SiO_2$) or other electrically insulating mineral filler materials like $Al_2O_3$ or organic filler materials. Various techniques may be employed to cover the components of the device 1000 with the mold material 13, for example compression molding, injection molding, powder molding, liquid molding and transfer molding.

Before or after the encapsulation with the mold material 13, the individual devices 1000 are separated from one another by separation of the leadframe 60, for example by sawing or cutting the dams. As illustrated in FIG. 10G the leads 62 may be bent and/or trimmed in order to mount the device 1000 on a circuit board. Instead of having the leads 62 protruding from the mold material 13, it is also possible to have a leadless device 1000.

Figure 11:
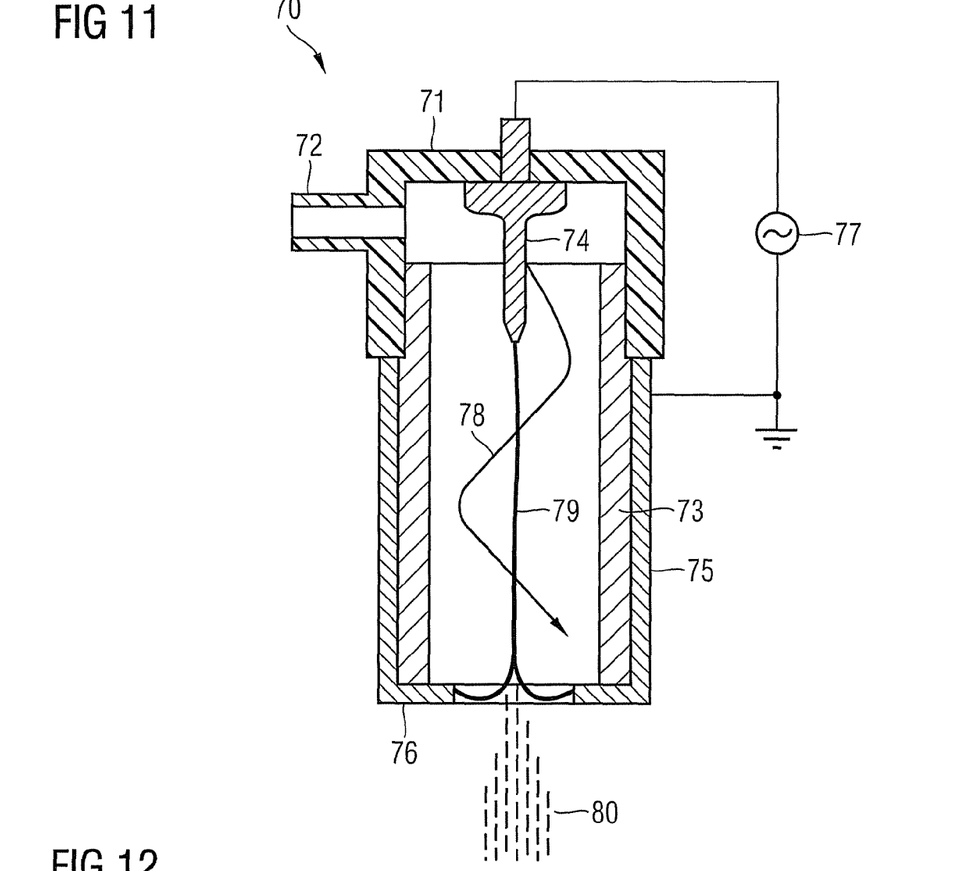
FIG. 11 schematically illustrates one embodiment of a plasma jet generator.

For the purpose of a corrosion prevention the devices 100 to 1000 may be coated with a layer of $Si_xO_yC_z$, wherein the x, y and z may be integers or fractions. The layer of $Si_xO_yC_z$ may be deposited by using an atmospheric pressure plasma jet generator 70 as schematically illustrated in FIG. 11. The plasma jet generator 70 has a pot-shaped housing 71 with a lateral connection 72 to the supply line for a working gas. A nozzle pipe 73 is held inside the housing 71 in a coaxial position. A pin electrode 74 is centered inside the housing 71. The outer circumference of the nozzle pipe 73 is covered by a jacket 75 made of electrically conductive material forming a ring electrode 76 at the unattached front or lower end of the nozzle pipe 73. A high frequency generator 77 applies an alternating current between the ring electrode 76 and the pin electrode 74. The connection 72 for the working gas is installed such that the supplied working gas spins helically as it flows through the nozzle pipe 73 as indicated by the helical arrow 78 in FIG. 11. When an appropriate voltage is applied between the pin electrode 74 and the ring electrode 76, a corona discharge takes place at the tip of the pin electrode 74. This corona discharge provides the necessary ions to strike an arc discharge 79 from the pin electrode 74 to the ring electrode 76 when the voltage is increased. The arc discharge 79 produces a plasma jet 80 which is used for the treatment of the surfaces of the devices 100 to 1000.

Volatile organic silicon compounds, for example tetraethoxysilane (TEOS), may be supplied to the connection 72 as a working gas. The plasma converts the organic silicon compounds to high reactive chemical molecule fragments. These molecule fragments are transported to the surfaces of the devices 100 to 1000 where they polymerize to $Si_xO_yC_z$. The thickness of the layers produced by this method may be smaller than 5 μm.

Figure 12:
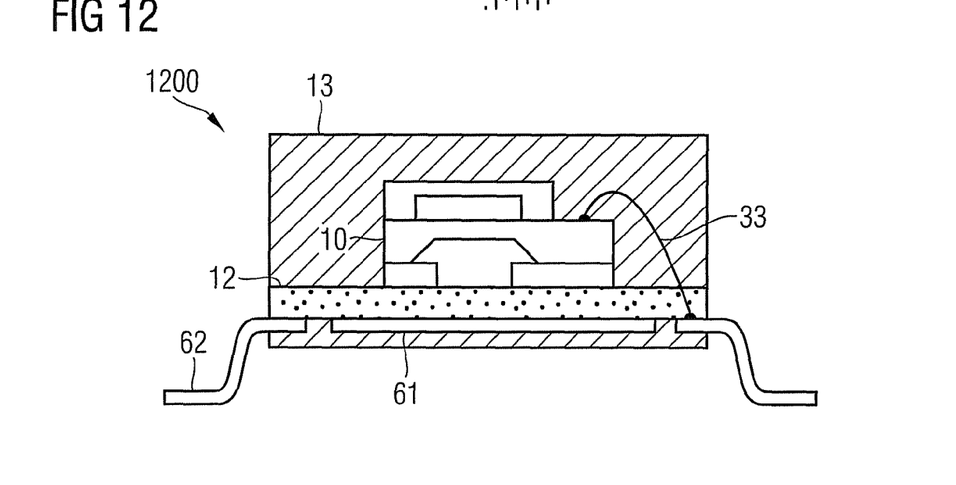
FIG. 12 schematically illustrates one embodiment of a sensor device including a semiconductor chip having a sensing region, a porous structure element and a leadframe.

A sensor device 1200 according to one embodiment is schematically illustrated in FIG. 12 in cross section. The sensor device 1200 is identical to the sensor device 1000 illustrated in FIG. 10G in many ways. In contrast to the sensor device 1000, the sensor device 1200 does not contain the second semiconductor chip 16, but the porous structure element 12 is directly attached to the die pad 61. Furthermore, at least two side surfaces of the porous structure element 12 are exposed from the mold material 13 in the sensor device 1200.

Figure 13:
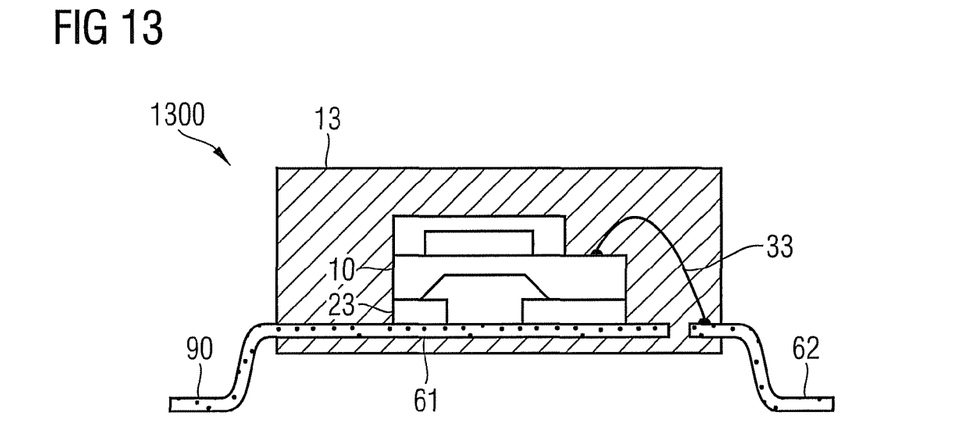
FIG. 13 schematically illustrates one embodiment of a sensor device including a semiconductor chip having a sensing region and a porous leadframe.

A sensor device 1300 according to one embodiment is schematically illustrated in FIG. 13 in cross section. In contrast to the sensor device 1200, the substrate 23 of the sensor device 1300 is directly placed onto the die pad 61 and the leadframe 60 is made of a porous metal, for example cast iron. The die pad 61 and at least one lead 90 are made in one piece so that the die pad 61 and the lead 90 have the same function as the porous structure element 12 of sensor device 1200.

Figure 14:
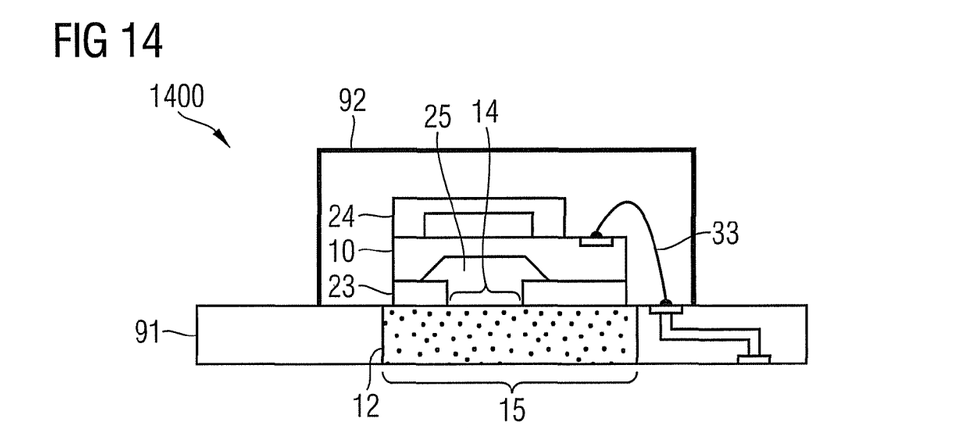
FIG. 14 schematically illustrates one embodiment of a sensor device including a semiconductor chip having a sensing region and a circuit board having a porous region.

A sensor device 1400 according to one embodiment is schematically illustrated in FIG. 14 in cross section. In the sensor device 1400 the stack consisting of the substrate 23, the first semiconductor chip 10 and the substrate 24 is mounted on a circuit board 91. The porous structure element 12 is integrated such into the circuit board 91 that it covers the through-hole 25 in the substrate 23 and the lower surface of the porous structure element 12 is exposed. Thus, in this embodiment, the second region 15 is the lower surface of the porous structure element 12. Moreover, a housing 92 is placed over the stack consisting of the substrate 23, the first semiconductor chip 10 and the substrate 24 as well as the bond wires 33 coupling the first semiconductor chip 10 to the circuit board 91.

Figure 15:
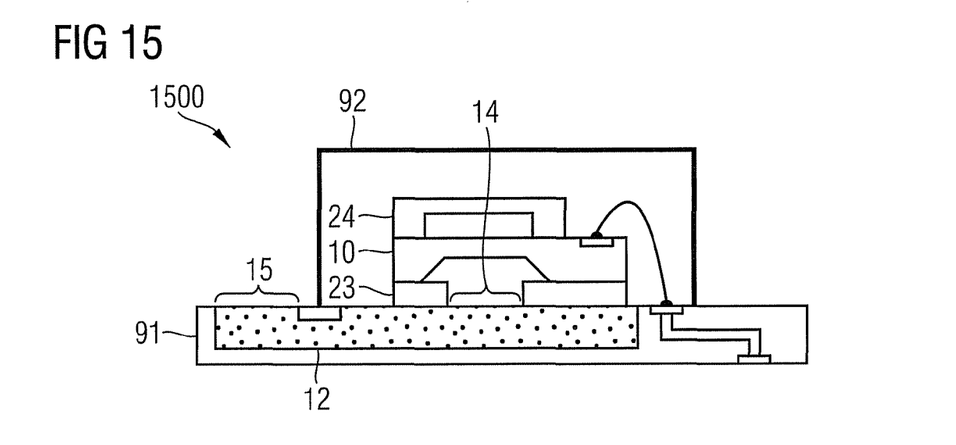
FIG. 15 schematically illustrates one embodiment of a sensor device including a semiconductor chip having a sensing region and a circuit board having a porous region.

A sensor device 1500 according to one embodiment is schematically illustrated in FIG. 15 in cross section. The sensor device 1500 is almost identical to the sensor device 1400, however the shape of the porous structure element 12 is different. In the sensor device 1500 the porous structure element 12 is shaped such that the exposed second region 15 of the porous structure element 12 is located on the upper surface of the circuit board 91.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A sensor device, comprising:
   a first semiconductor chip having a sensing region;
   a porous structure element comprising an interconnected network of pores, the porous structure element attached to the first semiconductor chip with a first region of the porous structure element facing the sensing region of the first semiconductor chip; and
   an encapsulation material partially encapsulating the first semiconductor chip and the porous structure element.

2. The sensor device of claim 1, wherein the encapsulation material encapsulates the porous structure element such that a second region of the porous structure element is exposed.

3. The sensor device of claim 2, wherein the first region of the porous structure element is in fluid connection with the second region of the porous structure element.

4. The sensor device of claim 1, wherein the sensing region comprises at least one of a membrane, a cantilever, a bridge, a gas sensing region and a tongue region.

5. The sensor device of claim 1, wherein the sensor device is at least one of a pressure sensor, a tire pressure sensor, a gas sensor and a humidity sensor.

6. The sensor device of claim 1, further comprising:
   a second semiconductor chip attached to the porous structure element.

7. The sensor device of claim 6, wherein the first semiconductor chip is electrically coupled to the second semiconductor chip.

8. The sensor device of claim 1, wherein the porous structure element comprises pores having diameters smaller than 500 μm.

9. The sensor device of claim 1, wherein the porous structure element is made of at least one of glass frit, ceramic frit, porous metal, porous hardened adhesive material and aerogel.

10. The sensor device of claim 1, wherein at least an outer surface of the porous structure element is coated with a hydrophobic material.

11. The sensor device of claim 1, wherein the sensing region of the first semiconductor chip is covered by the porous structure element.

12. A sensor device, comprising:
    a first semiconductor chip having a sensing region;
    a porous structure element comprising an interconnected network of pores, the porous structure element having a first side attached to the first semiconductor chip, the porous structure element comprising a first region facing the sensing region of the first semiconductor chip and an exposed second region in fluid connection with the first region; and
    an encapsulation material partially encapsulating the first semiconductor chip and the porous structure element.

13. The sensor device of claim 12, further comprising:
    a second semiconductor chip attached to a second side of the porous structure element, the second side opposite the first side.

14. The sensor device of claim 13, further comprising:
    at least one bond wire electrically coupling the first semiconductor chip to the second semiconductor chip.

15. The sensor device of claim 12, further comprising:
    a leadframe comprising a die pad attached to a second side of the porous structure element, the second side opposite the first side.

16. The senor device of claim 12, wherein the porous structure element is a leadframe.

17. The sensor device of claim 12, wherein the porous structure element is integrated into a circuit board.

* * * * *